United States Patent
Han

(10) Patent No.: US 12,514,078 B2
(45) Date of Patent: Dec. 30, 2025

(54) LIGHT EMITTING DISPLAY DEVICE AND METHOD OF REPAIRING THE SAME

(71) Applicant: LG Display Co., Ltd., Seoul (KR)

(72) Inventor: Jun Hee Han, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 535 days.

(21) Appl. No.: 17/974,060

(22) Filed: Oct. 26, 2022

(65) Prior Publication Data

US 2023/0217740 A1 Jul. 6, 2023

(30) Foreign Application Priority Data

Dec. 31, 2021 (KR) .................. 10-2021-0194794

(51) Int. Cl.
*H10K 59/131* (2023.01)
*H10K 71/00* (2023.01)

(52) U.S. Cl.
CPC ......... *H10K 59/131* (2023.02); *H10K 71/861* (2023.02)

(58) Field of Classification Search
CPC .. H10K 59/131; H10K 59/12; H10K 59/1213; H10K 59/125; H10K 71/861
See application file for complete search history.

(56) References Cited

U.S. PATENT DOCUMENTS

| 2015/0187804 A1* | 7/2015 | Park .................. H10D 86/60 |
| | | 257/43 |
| 2018/0151658 A1 | 5/2018 | Jeong et al. |
| 2019/0131318 A1 | 5/2019 | Xue et al. |

FOREIGN PATENT DOCUMENTS

| CN | 111524954 A | 8/2020 |
| CN | 111584641 A | 8/2020 |
| JP | 2005-92154 A | 4/2005 |
| JP | 2009-186844 A | 8/2009 |
| JP | 2011-197686 A | 10/2011 |
| KR | 10-2015-0112447 A | 10/2015 |
| KR | 10-2174003 B1 | 11/2020 |

* cited by examiner

*Primary Examiner* — Tucker J Wright
(74) *Attorney, Agent, or Firm* — Birch, Stewart, Kolasch & Birch, LLP

(57) ABSTRACT

A light emitting display device including a substrate; a plurality of subpixels on the substrate, each subpixel including a driving transistor and a light emitting diode connected to the driving transistor; and a plurality of scan and data lines electrically connected with the plurality of subpixels. Further, the driving transistor includes a driving gate electrode; a first active layer pattern including a first area not overlapping the driving gate electrode and a second area overlapping the driving gate electrode, wherein the second area includes a first hole overlapping with the driving gate electrode; a driving drain electrode connected to a first portion of the first area; and a driving source electrode connected to a second portion of the first area spaced apart from the first portion of the first area

17 Claims, 11 Drawing Sheets

LIGHT EMITTING DISPLAY DEVICE AND METHOD OF REPAIRING THE SAME

CROSS-REFERENCE TO RELATED APPLICATION

This application claims the benefit of Korean Patent Application No. 10-2021-0194794, filed on Dec. 31, 2021, the entirety of which is hereby incorporated by reference into the present application.

BACKGROUND OF THE INVENTION

Field of the Invention

The present disclosure relates to a light emitting display device, and more particularly to a light emitting display device with an active layer having a portion not overlapping a driving electrode and which is laser cut, whereby a subpixel is normally operated through a short circuit of a metal adjacent to the active layer pattern when foreign matter is generated, and a method of repairing the same.

Discussion of the Related Art

Display devices having excellent performance, slimness, light weight, and low power consumption have replaced a conventional cathode ray tube (CRT). Among the display devices, a light emitting display device provides a compact device with a vivid color display without using a separate light source. When a defective subpixel is detected in an inspection step, a repair process is performed so the subpixel becomes a dark dot. However, if more than a predetermined number of subpixels are repaired to produce dark dots, the display panel is degraded.

SUMMARY OF THE INVENTION

Accordingly, one object of the present disclosure is to provide a light emitting display device and a method of repairing the same that substantially obviate one or more problems due to limitations and disadvantages of the related art.

Another object of the present disclosure is to provide a light emitting display device having an active layer pattern with an altered shape, such that the changed active layer pattern of the portion at which foreign matter is generated is optionally separated from a metal adjacent thereto along the portion at which the foreign matter is generated, and a normal operation is performed at the remaining area of the active pattern, whereby repair for normalization is possible, and a method of repairing the same.

In a light emitting display device according to the present disclosure, a hole is provided in an active layer pattern, and a gate metal that does not overlap the active layer pattern and another metal by the hole is used as a repair portion, whereby it is possible to normalize a subpixel through a detour area.

To achieve these objects and other advantages and in accordance with the purpose of the invention, as embodied and broadly described herein, the present disclosure provides a light emitting display device includes a plurality of subpixels on a substrate, wherein each of the subpixels includes a driving transistor and a light emitting diode connected to the driving transistor. The driving transistor can include a driving gate electrode, a first active layer pattern traversing the driving gate electrode while overlapping the driving gate electrode, the first active layer pattern having a first hole in an overlapping part with the driving gate electrode, and a driving source electrode and a driving drain electrode connected to the area of the first active layer pattern that does not overlap the driving gate electrode, the driving source electrode and the driving drain electrode being spaced apart from each other.

It is to be understood that both the foregoing general description and the following detailed description of the present disclosure are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
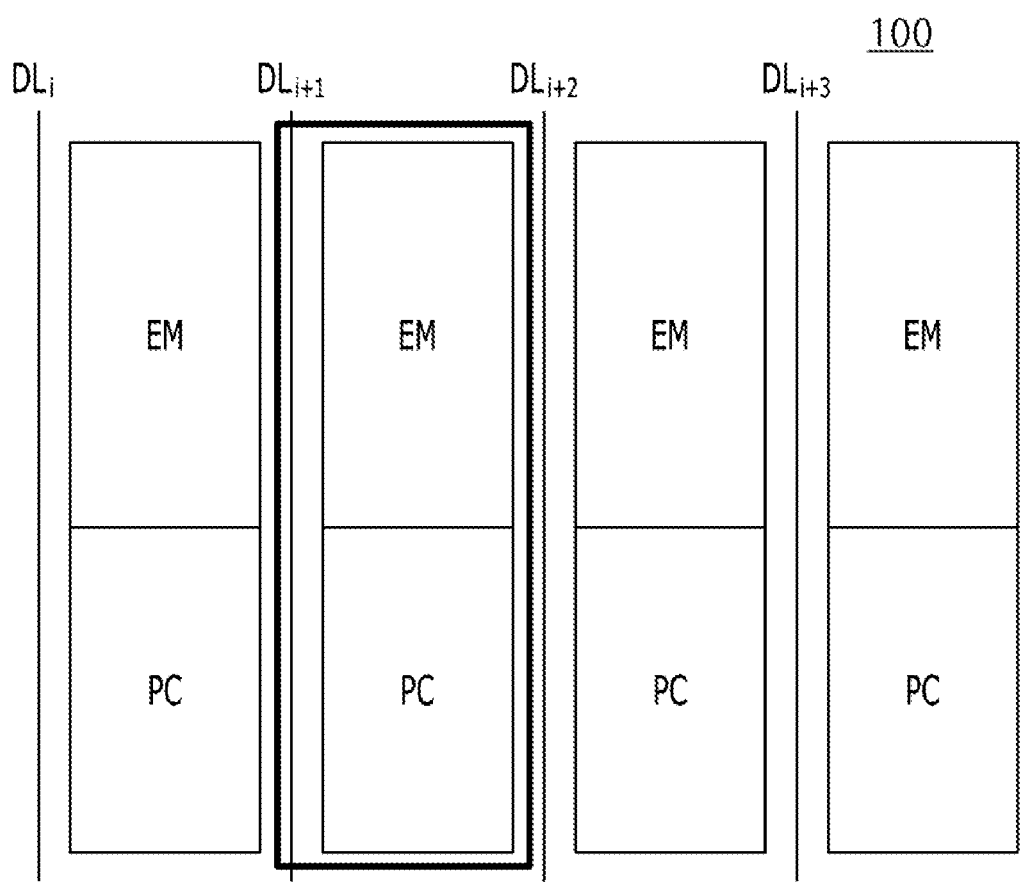
FIG. 1 is a plan view schematically showing a light emitting display device according to an embodiment of the present disclosure.

Reference will now be made in detail to preferred embodiments of the present invention, examples of which are illustrated in the accompanying drawings. Wherever possible, the same reference numbers will be used throughout the drawings to refer to the same or like parts. In the following description of the present invention, detailed descriptions of known functions and configurations incorporated herein will be omitted when the same may obscure the subject matter of the present invention. In addition, the names of elements used in the following description are selected in consideration of clarity of description of the specification, and may differ from the names of elements of actual products.

The shape, size, ratio, angle, number, and the like shown in the drawings to illustrate various embodiments of the present invention are merely provided for illustration, and the invention is not limited to the content shown in the drawings. Wherever possible, the same reference numbers will be used throughout the drawings to refer to the same or like parts. In the following description, detailed descriptions of technologies or configurations related to the present invention may be omitted so as to avoid unnecessarily obscuring the subject matter of the present invention. When terms such as "including", "having", and "comprising" are used throughout the specification, an additional component may be present, unless "only" is used. A component described in a singular form encompasses a plurality thereof unless particularly stated otherwise.

The components included in the embodiments of the present invention should be interpreted to include an error range, even if there is no additional particular description thereof. In describing the variety of embodiments of the present invention, when terms describing positional relationships such as "on", "above", "under" and "next to" are used, at least one intervening element may be present between the two elements, unless "immediately" or "directly" is used.

In describing the variety of embodiments of the present invention, when terms related to temporal relationships, such as "after", "subsequently", "next" and "before", are used, the non-continuous case may be included, unless "immediately" or "directly" is used. In describing the variety of embodiments of the present invention, terms such as "first" and "second" may be used to describe a variety of components, but these terms only aim to distinguish the same or similar components from one another. Accordingly, throughout the specification, a "first" component may be the same as a "second" component within the technical concept of the present invention, unless specifically mentioned otherwise.

Features of various embodiments of the present disclosure may be partially or completely coupled to or combined with each other, and may be variously inter-operated with each other and driven technically. The embodiments of the present disclosure may be carried out independently from each other, or may be carried out together in an interrelated manner.

Figure 2:
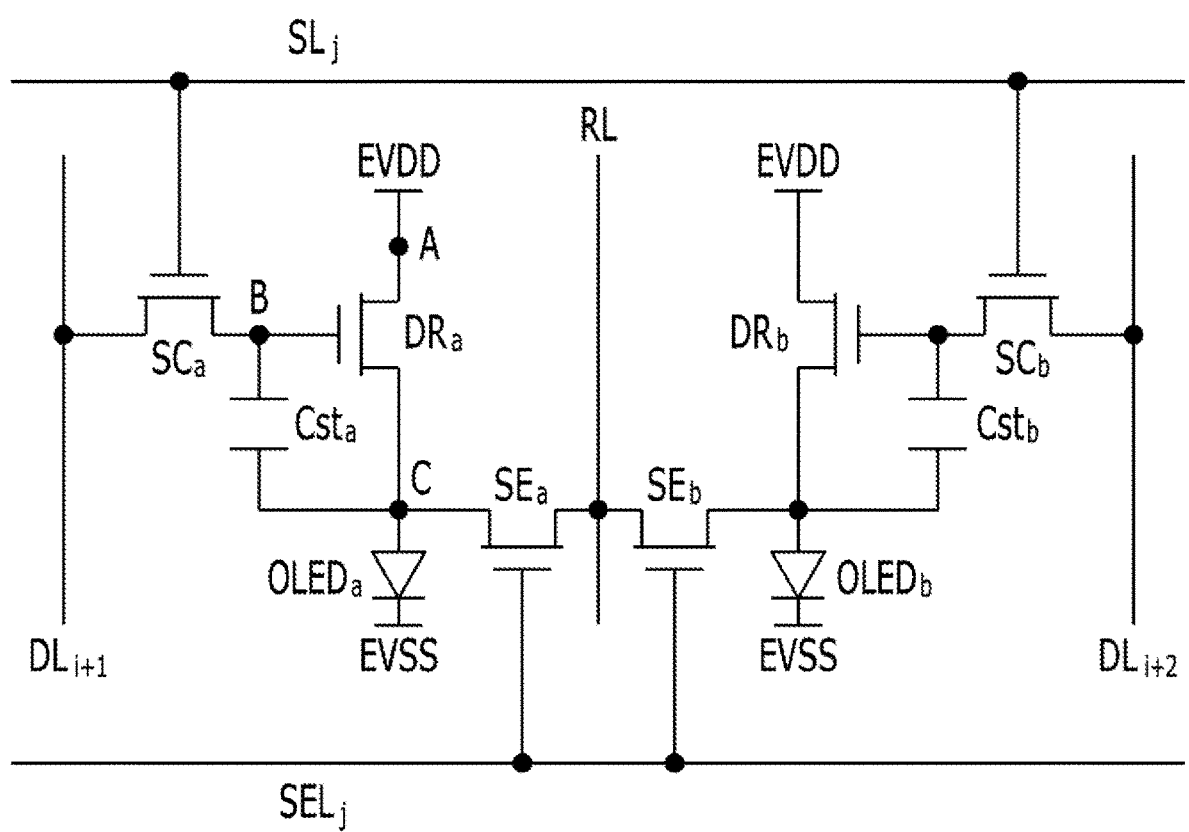
FIG. 2 is a circuit diagram of two adjacent subpixels of FIG. 1.

FIG. 1 is a plan view schematically showing a light emitting display device according to an embodiment of the present disclosure, and FIG. 2 is a circuit diagram of two adjacent subpixels of FIG. 1. As shown in FIG. 1, the light emitting display device includes a substrate 100 having a plurality of subpixels with each subpixel including an emission portion EM and a pixel circuit PC. In the example shown, the emission portion EM and the pixel circuit PC are divided from each other. However, the present disclosure is not limited thereto. That is, the light emitting display device is also applicable to parts of the emission portion EM and the pixel circuit PC overlapping each other. For example, a top emission structure includes the emission portion EM and the pixel circuit PC overlapping each other. In this instance, a pixel circuit under a portion overlapping a first electrode of a light emitting diode is hidden by a reflective electrode, whereby an emission area is not limited. Also, in a bottom emission structure, a transparent or a semitransparent component is disposed to overlap the emission portion.

As shown in FIG. 1, each subpixel having an emission portion EM and a pixel circuit PC is disposed between adjacent data lines $DL_i$, $DL_{i+1}$, $DL_{i+2}$, and $DL_{i+3}$. In addition, FIG. 1 shows four adjacent subpixels SP as an example, in which red, green, blue, and white subpixels are disposed side by side. The subpixels can be regularly and repeatedly disposed on the substrate 100 as an example. Three red, green, and blue subpixels can also be repeatedly disposed, or subpixels having different color combinations can be regularly disposed. Also, three or four subpixels that emit different colors of light can define one pixel.

Further, the subpixel SP is a unit having a specific type of color filter or a unit in which a light emitting diode emits a special color of light without a color filter. Colors defined in the subpixel SP include a red color (R), a green color (G), and a blue color (B). A white color (W) can also be included; however, the present disclosure is not limited thereto.

As shown in FIG. 2, the subpixels are provided between scan lines $SL_j$ and data lines $DL_{i+1}$ and $DL_{i+2}$ intersecting each other. Specifically, when the pixel circuit PC of each subpixel has a 3T1C circuit structure, a subpixel is defined between the scan line $SL_j$ and a sensing line $SEL_j$ in a horizontal direction and between the data line $DL_{i+1}$ or $DL_{i+2}$ and a reference line RL in a vertical direction. The subpixel also includes a driving transistor $DR_a$ or $DR_b$, a switching transistor $SC_a$ or $SC_b$, a sensing transistor $SE_a$ or $SE_b$, and a storage capacitor $Cst_a$ or $Cst_b$. A light emitting diode $OLED_a$ or $OLED_b$ is also included.

In FIG. 2, the pixel circuit PC on the left of the reference source voltage line RL and the pixel circuit PC on the right of the reference source voltage line RL are called area "a" and area "b," respectively. The pixel circuit PC included in each subpixel will be described with reference to FIG. 2.

As shown, the switching transistor $SC_a$ or $SC_b$ is formed at the intersection between the scan line $SL_j$ and the data line $DL_{i+1}$ or $DL_{i+2}$ and performs a function of selecting a subpixel corresponding thereto. Further, the driving transistor $DR_a$ or $DR_b$ performs a function of driving the light emitting diode $OLED_a$ or $OLED_b$ of the subpixel selected by the switching transistor $SC_a$ or $SC_b$ connected via a second node B. As shown, the driving transistor DR is also connected to the light emitting diodes $OLED_a$ or $OLED_b$ via a third node C, and controls the driving current of the light emitting diodes $OLED_a$ or $OLED_b$. In addition, the sensing transistor SE is provided between the third node C and the reference source voltage line RL, and supplies a reference voltage signal from the reference source voltage line RL to the light emitting diodes $OLED_a$ or $OLED_b$ through an initialization signal or a sensing signal supplied from the sensing line $SEL_j$.

Further, a scan driver supplying a scan signal to the scan line SL and a data driver supplying a data signal to the data line DL can be included in an area outside an active area including the subpixels of the substrate 100. A driving source voltage signal EVDD can also receive a driving voltage from a power supply provided in the area outside the active area, or receive the driving voltage through the data driver.

The scan driver, the data driver, and the power supply can also be directly mounted in the area outside the active area on the substrate 100 when a thin film transistor is formed in the active area, or a separate film or a printed circuit board can be attached to the area outside the active area on the substrate 100.

In addition, the light emitting diode OLED emits light upon receiving current through the driving transistor DR. In more detail, the light emitting diode OLED includes a first electrode, an organic layer including an emission layer, and a second electrode. One of the first and second electrodes is an anode, and the other is a cathode. The first electrode is also connected to a driving source electrode or a driving drain electrode of the driving transistor DR, and the second electrode is connected to a low source voltage line to which a low source voltage is applied. The connection between the driving transistor DR and the first electrode can be any one of the driving source electrode and the driving drain electrode, and this can be changed depending on whether the transistor is a p-type transistor or an n-type transistor. Hereinafter, a description will be given based on an example in which the driving source electrode of the driving transistor DR is connected to the first electrode of the light emitting diode.

Further, the organic layer of the light emitting diode OLED can include a hole transport layer and an electron transport layer, in addition to the emission layer. When a voltage is applied to the first and second electrodes, holes and electrons move to the emission layer of the light emitting diode OLED via the hole transport layer and the electron transport layer, respectively, and the holes and electrons are combined with each other in the emission layer, whereby light is emitted.

Further, the driving transistor DR is disposed between a source voltage line to which a driving source voltage EVDD is supplied and the light emitting diode OLED. In more detail, the driving transistor DR adjusts current that flows to the light emitting diode OLED based on a voltage difference between the driving gate and source electrodes. At the second node B, the driving gate electrode of the driving transistor DR is connected to a switching source electrode of the switching transistor SC. The driving drain electrode is also connected to the source voltage line to which driving source voltage EVDD is supplied via the first node A, and the driving source electrode is connected to the first electrode of the light emitting diode OLED at the third node C.

In addition, the switching transistor $SC_a$ is turned on by a j-th scan signal of a j-th scan line $SL_j$ to supply voltage from an (i+1)-th data line $DL_{i+1}$ to the driving gate electrode of the driving transistor $DR_a$. A switching gate electrode of the switching transistor $SC_a$ is also connected to the j-th scan line $SL_j$, a switching source electrode of the switching transistor $SC_a$ is connected to the gate electrode of the driving transistor DR, and a switching drain electrode of the switching transistor $SC_a$ is connected to the (i+1)-th data line $DL_{i+1}$.

Also, the sensing transistor $SE_a$ is turned on by a j-th initialization signal of a j-th sensing line $SEL_j$ to connect the reference voltage line RL to the driving source electrode of the driving transistor DR. A sensing gate electrode of the sensing transistor $SE_a$ is connected to the j-th sensing line $SEL_j$, a sensing drain electrode of the sensing transistor $SE_a$ is connected to the reference voltage line RL, and a sensing source electrode of the sensing transistor $SE_a$ is connected to the source electrode of the driving transistor $DR_a$.

Further, the storage capacitor $Cst_a$ is formed between the driving gate and source electrodes of the driving transistor $DR_a$. In particular, the storage capacitor $Cst_a$ stores differential voltage between the gate and source voltages of the driving transistor $DR_a$. The first electrode is also connected to the second node B, at which the switching transistor $SC_a$ and the driving transistor $DR_a$ are connected to each other. Also, the second electrode is connected to the third node C, at which the driving transistor $DR_a$, the light emitting diode OLED, and the sensing transistor $SE_a$ are connected to each other.

In FIG. 2, the switching transistors $SC_a$ and $SC_b$, the driving transistors $DR_a$ and $DR_b$, and the sensing transistors $SE_a$ and $SE_b$ can be constituted by thin film transistors. In addition, FIG. 2 shows the driving transistors $DR_a$ and $DR_b$, the switching transistors $SC_a$ and $SC_b$, and the sensing transistors $SE_a$ and $SE_b$ as an N-type semiconductor transistor having N-type semiconductor characteristics as an example. However, the present disclosure is not limited thereto. All or some transistors can be constituted by P-type semiconductor transistors having P-type semiconductor characteristics.

In addition, the scan driver sequentially supplies a scan signal to a plurality of scan lines SL. For example, the scan driver supplies a scan signal to the scan lines SL in response to a control signal supplied from a timing controller, which is a control circuit. In addition, the data driver supplies a data signal to selected data lines $DL_1$ to $DL_i$ to $D_{i+m}$, among the data lines $DL_i$ in response to a control signal supplied from the outside, e.g., the timing controller. The data signal supplied to the data lines $DL_1$ to $DL_m$ is also supplied to a subpixel selected by a scan signal whenever the scan signal is supplied to scan lines $SL_i$ to $SL_j$ to $SL_{j+n}$. As a result, the subpixel is charged with a voltage corresponding to the data signal and emits light with a luminance corresponding thereto.

In the light emitting display device according to the present disclosure, a subpixel having foreign matter can be repaired and normally operated. For example, a least one electrode of the driving transistor DR can be a target to be repaired. In addition, the electrode has a portion that does not overlap an adjacent active layer pattern. Further, a short circuit is provided through the non-overlapping portion, and normal operation thereof is achieved through the remaining effective pattern. The construction of each subpixel of the light emitting display device according to an embodiment of the present disclosure will now be described in detail with reference to the drawings.

Figure 3:
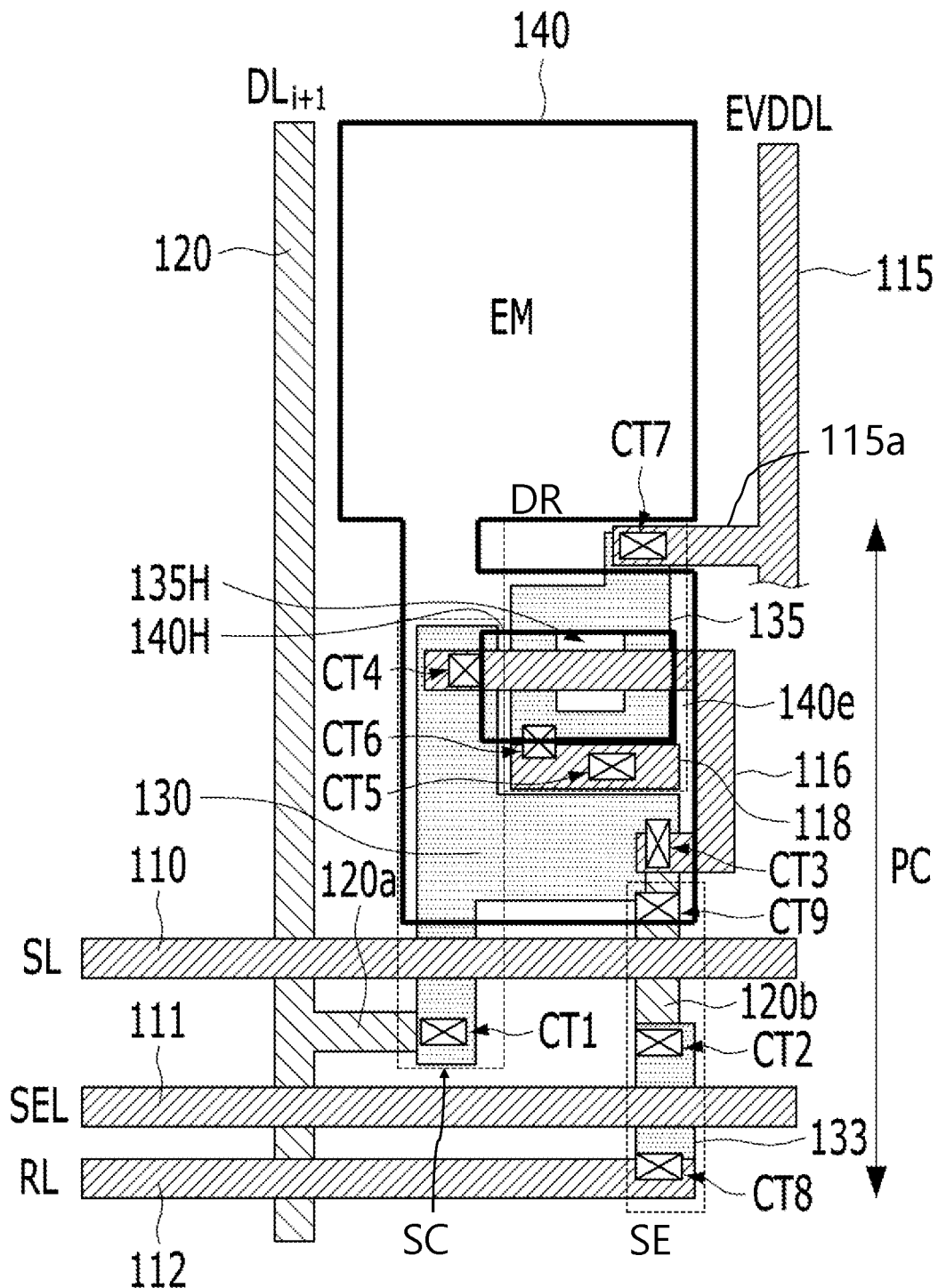
FIG. 3 is a plan view of one subpixel of FIG. 1.
Figure 4:
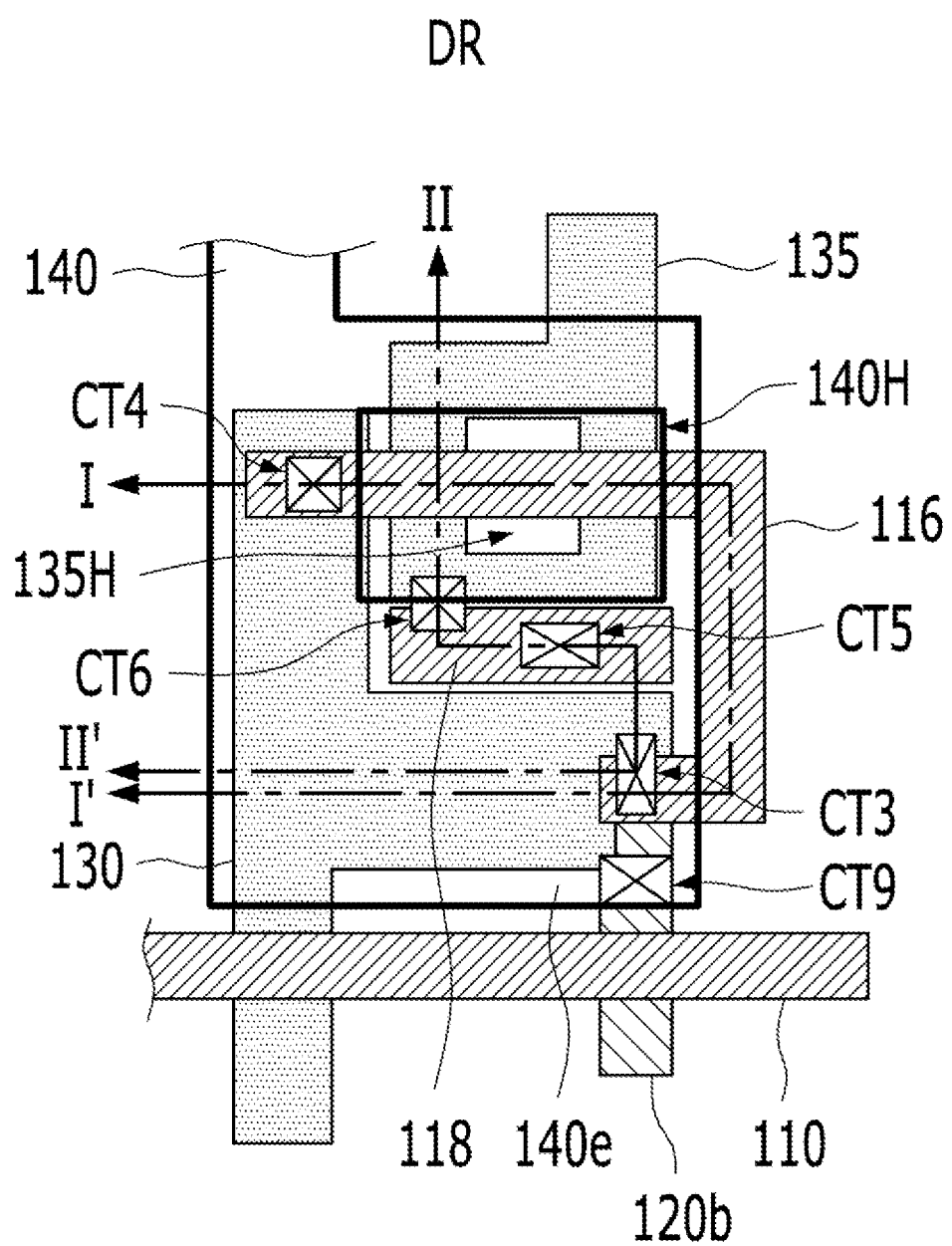
FIG. 4 is an enlarged plan view of a driving circuit of the light emitting display device according to the embodiment of the present disclosure.
Figure 5:
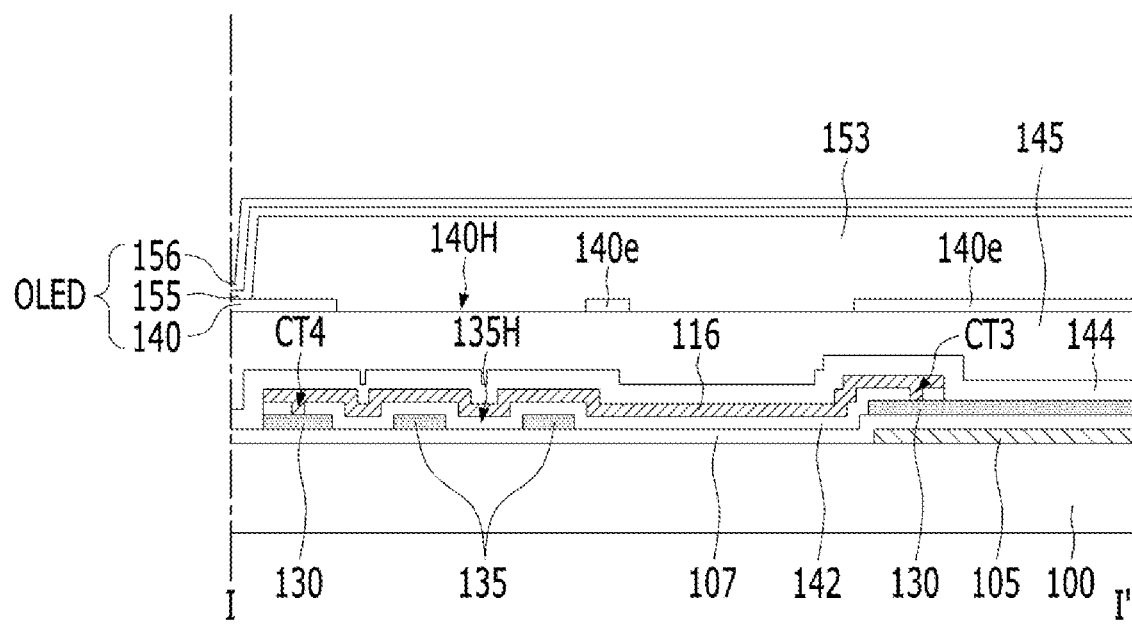
FIG. 5 is a sectional view taken along line I-I' of FIG. 4.
Figure 6:
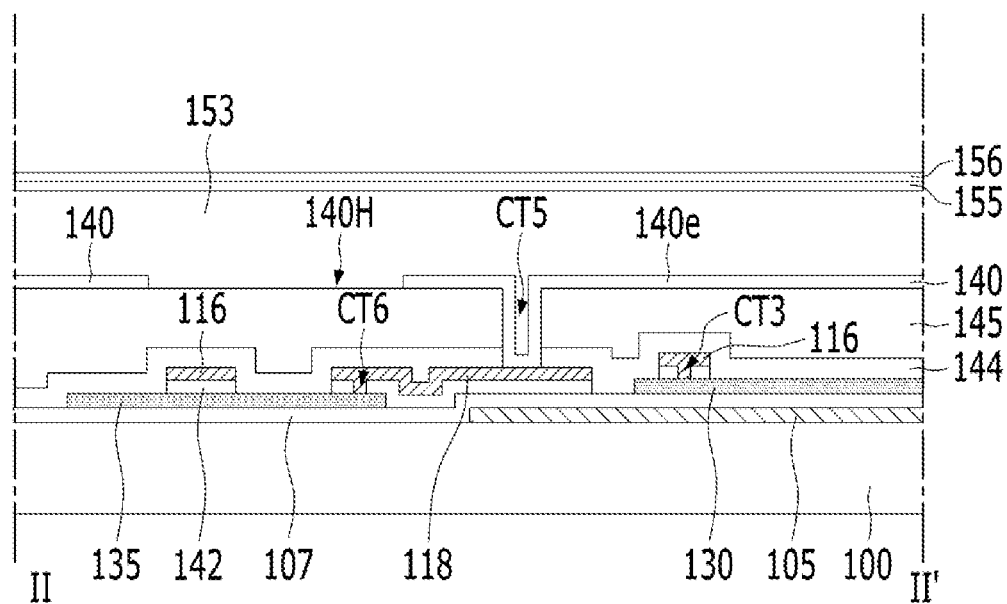
FIG. 6 is a sectional view taken along line II-II' of FIG. 4.

In particular, FIG. 3 is a plan view of one subpixel of FIG. 1, FIG. 4 is an enlarged plan view of the driving circuit of the light emitting display device according to the embodiment of the present disclosure, FIG. 5 is a sectional view taken along I-I' of FIG. 4, and FIG. 6 is a sectional view taken along II-II' of FIG. 4.

As described previously with respect to FIGS. 1 and 2, the light emitting display device includes a substrate 100 having a plurality of subpixels EM+PC, each of which includes an emission portion EM and a pixel circuit PC, a driving transistor DR provided in the pixel circuit PC, and a light emitting diode OED connected to the driving transistor DR and extending to the emission portion.

As shown in FIGS. 3 to 6, the driving transistor DR can include a driving gate electrode 116, and a first active layer pattern 135 traversing the driving gate electrode 116 while overlapping the driving gate electrode 116. The first active layer pattern 135 also has a first hole 135H in a part of the overlapping portion. The driving transistor DR also includes a driving source electrode 118 and a driving drain electrode 115a connected to the area of the first active layer pattern 135 not overlapping the driving gate electrode 136. Further, the driving source electrode 118 and the driving drain electrode 115a are spaced apart from each other.

In addition, a part of the first hole 135H of the first active layer pattern 135 and a part of the first active layer pattern 135 surrounding the first hole 135H can be exposed on opposite sides of the driving gate electrode 116 intersecting the first active layer pattern 135. The exposed first active layer pattern 135 can thus be connected to the driving drain electrode 115a via a seventh contact hole CT7, and connected to the driving source electrode 118 via a sixth contact hole CT6.

Further, the light emitting diode OLED includes a first electrode 140 formed in the emission portion EM, and a first electrode extension portion 140e formed integrally with the first electrode 140. In addition, the first electrode extension portion 140e extends to the pixel circuit PC. The light emitting diode OLED also includes an organic emission layer 155 provided on at least the first electrode 140, and a second electrode 156 provided on the organic emission layer. The first electrode extension portion 140e can also include a larger second hole 140H than the first hole 135H.

According to one embodiment, the first hole 135H is formed in at least the first active layer pattern 135, which is a semiconductor layer, of the driving transistor DR. Also, the driving gate electrode 116 has a portion that does not overlap another metal or the active layer pattern in the form of the first hole 135H. The non-overlapping portion is set as a short circuit area after foreign matter inspection, and the remaining area is used as a normalization current path, whereby the subpixel is normalized.

Thus, the light emitting display device according to an embodiment of the present disclosure can be repaired to solve a short circuit problem occurring between the gate metal layer and the active layer mainly due to conductive foreign matter. For example, a gate insulating film 142 can be provided between the gate metal layer and the active layer. In more detail, the gate insulating film 142 includes an inorganic material, such as an oxide film, a nitride film, or an oxynitride film, and has a small thickness of 1 µm or less.

Thus, a conductive foreign matter between the gate metal layer and the active layer, causes a short circuit, and the thin film transistor including the short-circuited active layer cannot be normally operated. When the thin film transistor that cannot be normally operated is included in, for example, the pixel driving portion of FIG. 2, the light emitting diode remains off or on irrespective of whether the subpixel is turned on. When the light emitting diode remains off, the subpixel appears as a dark dot, and when the light emitting diode remains on, the subpixel appears as a bright dot.

Thus, when a short circuit occurs between the gate metal layer and the active layer, opposite sides of the gate metal layer at the short-circuited region are divided from each other, whereby normalization is possible by detouring a current path in the remaining thin film transistor. That is, when a hole for repair is provided in the first active layer included in the driving transistor supplying a driving current to the light emitting diode, one side and the other side of the driving gate electrode are connected to each other at a second active layer or a third active layer spaced apart from the first active layer, whereby a detour path or operation is possible even though a part of the interior of the driving gate electrode floats.

That is, the driving gate electrode 116 can have a first non-overlapping portion not overlapping the first active layer pattern 135 and the first electrode extension portion 140e in the first hole 135H, and can have at least one second non-overlapping portion spaced apart from the first non-overlapping portion corresponding to the first hole 135H and that does not overlap the first active layer pattern 135 and the first electrode extension portion 140e between one side and the other side of the driving gate electrode 116. In the example shown in FIGS. 3 to 6, the second non-overlapping portion is provided outside the first active layer pattern 135 at the left side of the first hole 135H. In addition, the driving gate electrode 116 can be provided outside the first electrode extension portion 140e so as not to overlap the first active layer pattern 135, whereby the second non-overlapping portion is formed.

In addition, a second hole 140H of the first electrode extension portion 140e is formed to overlap the first hole 135H while having a larger size than the first hole 135H, whereby the second hole 140H is used as a separation rear of the driving gate electrode 116 when the area of the first hole 135H is repaired. Further, the area of the driving gate electrode 116 that does not overlap the other metal and the active layer pattern can thus become the area to which a laser is applied such that a short circuit occurs at the repairing step after foreign matter inspection.

That is, a laser is applied to the region of the driving gate electrode 116 that does not overlap the first active layer pattern 135 around the area in which foreign matter is generated so as to be removed. At the time of repair, the driving gate electrode 116 is connected to the first active layer pattern 135 and a second active layer pattern 130 spaced apart from the first active layer pattern 135 via a fourth contact hole CT4 and a third contact hole CT3, respectively. Even when a short circuit occurs in a part of the interior of the driving gate electrode 116, a normal signal can be applied, and therefore the driving transistor DT including the driving gate electrode 116 can be normally operated.

Further, as shown in FIG. 3, the light emitting display device includes a scan line SL 110 and a data line DL 120 intersecting each other in the pixel circuit PC to divide the subpixels from each other. The light emitting device also includes a switching transistor SC provided at a region overlapping the scan line, a sensing line SEL 111 parallel to the scan line SL, and a sensing transistor SE provided at a region overlapping the sensing line, in addition to the driving transistor DR.

In addition, the switching transistor SC includes a switching drain electrode 120a spaced apart from the first active layer pattern 135. As shown, the switching drain electrode 120a protrudes from the second active layer pattern 130 and the data line DL 120 on the same layer, and extends to connect to one side of the second active layer pattern 130 in an overlapping state. Further, the driving gate electrode 116 is connected to the other side of the second active layer pattern 130, and the connection portion is used as a switching source electrode.

Also, the portion of the scan line SL 110 intersecting the second active layer pattern 130 can be used as a switching gate electrode. In addition, the switching source electrode and the switching gate electrode can be exchanged. Further, as shown, the switching transistor SC is connected to the switching drain electrode 120a and the driving gate electrode 116 via a first contact hole CT1 and the fourth contact hole CT4 at opposite sides of the second active layer pattern 130, respectively. The fourth contact hole CT4 functions as the second node B of FIG. 2, at which the driving transistor DR and the switching transistor SC are connected to each other.

In addition, the sensing transistor SE uses the sensing line SEL 111 as a sensing gate electrode, and includes a third active layer pattern 133 intersecting the sensing line SEL 111, a sensing source electrode 120b and a reference source voltage line RL connected to the third active layer pattern 133. Opposite sides of the third active layer pattern 133 are connected to the reference source voltage line RL and the sensing source electrode 120b via a second contact hole CT2 and an eighth contact hole CTB, respectively. Further, the sensing source electrode 120b extends to the first electrode extension portion 140e and is connected to the first electrode extension portion 140e via a ninth contact hole CT9.

In addition, the first electrode extension portion 140e is integrally formed with the first electrode 140 and is connected to the driving source electrode 118 via a fifth contact hole CT5. Thus, the fifth contact hole CT5 and the ninth contact hole CT9 commonly function as the third node C of FIG. 2, at which the driving transistor DR connected to the first electrode 140 of the light emitting diode OLED and the sensing transistor SE are connected to each other.

Further, the substrate 100 can be an insulative substrate made of plastic, glass, or ceramic. When the substrate 100 is made of plastic, the substrate can be slim and flexible. However, the material for the substrate 100 is not limited thereto, and the substrate can include a metal and an insulative buffer layer at the side at which lines are formed.

In addition, the first active layer pattern 135, the second active layer pattern 130, and the third active layer pattern 133 are formed spaced apart from each other on the same layer and have different constructions since the first active layer pattern 135 is located in an area in which repair is required after a foreign matter inspection and the second and third active layer patterns 130 and 133 are located in an area in which no repair is required.

For example, as shown in FIGS. 5 and 6, a lower light blocking metal 105 can be further provided under the second active layer pattern 130 to block light introduced into the second active layer pattern 130 through the substrate 100. Similarly, a lower light blocking metal 105 can be provided under the third active layer pattern 133. The lower light blocking metal 105 can be provided to correspond to only channel areas of the second and third active layer patterns 130 and 133, whereby it is possible to prevent generation of photocurrent in the active layer due to light blocking.

In addition, in the first active layer pattern 135, application of a laser to the driving gate electrode 116 from under the substrate 100 through the first hole 135H is performed at the time of repair. Therefore, the lower light blocking metal 105 can be omitted. Further, a lower light blocking metal 105 can be optionally further provided at the channel region of the first active layer pattern 135.

The data line 120 can also be formed by patterning on the layer at which the lower light blocking metal 105 is formed. In this instance, the lower light blocking metal 105, which inhibits generation of photocurrent in the active layer, and the data line 120 can be simultaneously formed, whereby it is possible to obtain a mask reduction effect. However, the light emitting display device according to an embodiment of the present disclosure is not limited thereto, and is also applicable to the lower light blocking metal 105 and the data line 120 being formed on different layers.

Also, an active buffer layer 107 configured to cover the lower light blocking metal 105 can be provided. The scan line 110, the sensing line 111, the reference source voltage line 112, the driving source voltage line 115, the driving drain electrode 115a protruding from the driving source voltage line 115, the driving gate electrode 116, and the driving source electrode 118 can also be formed on the same layer by patterning the same metal.

In addition, the gate insulating film 142 is provided under each of the scan line 110, the sensing line 111, the reference source voltage line 112, the driving source voltage line 115, the driving drain electrode 115a, the driving gate electrode 116, and the driving source electrode 118 on the same layer. The gate insulating film 142 can also be formed using the same mask as the scan line 110. Consequently, the gate insulating film 142 can have a width equal or similar to the width of each of the scan line 110, the sensing line 111, the reference source voltage line 112, the driving source voltage line 115, the driving drain electrode 115a, the driving gate electrode 116, and the driving source electrode 118, Here, because the driving transistor DR is located on the same layer as the driving gate, source and drain electrodes 116, 118 and 115a, the driving gate electrode 116 overlapping the first active layer pattern 135 in the form of an island via the gate insulating film 142 for channel formation is provided with the driving drain electrode 115a and the driving source electrode 118 while being sufficiently spaced apart therefrom in the plane, as shown in FIG. 3. That is, because the first active layer pattern 135 is electrically connected to the driving drain electrode 115a and the driving source electrode 118 via the seventh contact hole CT7 and the sixth contact hole CT6, respectively, the channel is spaced apart from the driving drain electrode 115a and the driving source electrode 118.

In addition, the first contact hole CT1 is formed to connect the switching drain electrode 120a and the second active layer pattern 130. Also, the second contact hole CT2 is formed to connect the sensing source electrode 120b and the third active layer pattern 133. The third and fourth contact holes CT3 and CT4 are formed to connect to the second active layer pattern 130 at opposite ends of the driving gate electrode 116. Also, the sixth contact hole CT6 is used to connect the driving source electrode 118 and the first active layer pattern 135, and the seventh contact hole CT7 is used to connect the driving drain electrode 115a and the first active layer pattern 135. In addition, the eighth contact hole CT8 is used to connect the reference source voltage line RL and the third active layer pattern 133. These contact holes are also provided in the gate insulating film 142 located between the metal layers in which the first to third active layer patterns 135, 130, and 133 and the driving gate electrode 116 are formed.

In addition, a first interlayer insulating film 144 is provided to cover the scan line 110, the sensing line 111, the reference source voltage line 112, the driving source voltage line 115, the driving drain electrode 115a, the driving gate electrode 116, and the driving source electrode 118. Also, a second interlayer insulating film 145 can be provided on the first interlayer insulating film 144 for planarization. The second interlayer insulating film 145 and the first interlayer insulating film 144 are then selectively removed to expose a part of the driving source electrode 118 and a part of the sensing source electrode 120b, whereby the fifth contact hole CT5 and the ninth contact hole CT9 are provided.

For example, the first interlayer insulating film 144 can be an inorganic insulating film, and the second interlayer insulating film 145 can be an organic insulating film. However, the present disclosure is not limited thereto. An interlayer insulating film made of a different material from the layer adjacent thereto can be further provided between the first and second interlayer insulating films 144 and 145 and on the second interlayer insulating film 145.

Further, a transparent metal material or a reflective metal material is deposited and patterned on the second interlayer insulating film 145 to provide a first electrode 140 disposed in the emission portion EM and a first electrode extension portion 140e integrally formed with the first electrode 140 and extending from the pixel circuit PV. The first electrode extension portion 140e is connected to the driving source electrode 118 exposed through the fifth contact hole CT5. Consequently, the fifth contact hole CT5, in which the driving transistor DR and the first electrode 140 of the light emitting diode OLED are electrically connected to each other, corresponds to the third node C of FIG. 2. In addition, the first electrode extension portion 140e is connected to the sensing source electrode 120b via the ninth contact hole CT9. The ninth contact hole CT9, in which the sensing transistor SE and the first electrode 140 of the light emitting diode OLED are electrically connected to each other, corresponds to the third node C of FIG. 2.

In addition, the pixel circuit PC includes a bank 153, in which an open area of the bank 153 is defined as the emission portion EM. The first electrode 140 located in the emission portion EM, the organic layer 155 including the organic emission layer thereon, and the second electrode 156 constitute the light emitting diode OLED.

In addition, the organic layer 155 can include a single common layer or a plurality of common layers between the first electrode 140 and the organic emission layer and between the organic emission layer and the second electrode 156. Also, the common layer can participate in injection and transport of holes and injection and transport of electrons. Further, the organic emission layer in the organic layer 155 may have a single-layered structure or a multilayered structure. When the organic emission layer has a multilayered structure, a charge generation layer can be provided between the organic emission layers, organic emission layers divided by the charge generation layer and/or a common layer adjacent thereto can constitute a stack, and the organic layer 155 can include a plurality of stacks between the first and second electrode 140 and the second electrode 156.

The common layer can be provided in the pixel circuit PC as well as the emission portion EM, and can be integrally formed over a plurality of subpixels. The organic emission layer can be provided in only the emission portion EM, or also be provided in the pixel circuit PC. When the organic emission layer is optionally provided in only the emission portion EM, a color conversion mechanism, such as a color filter, can be omitted at the side at which light is emitted outside.

Next, a method of repairing the light emitting display device according to a first embodiment of the present disclosure will be described.

Figure 7:
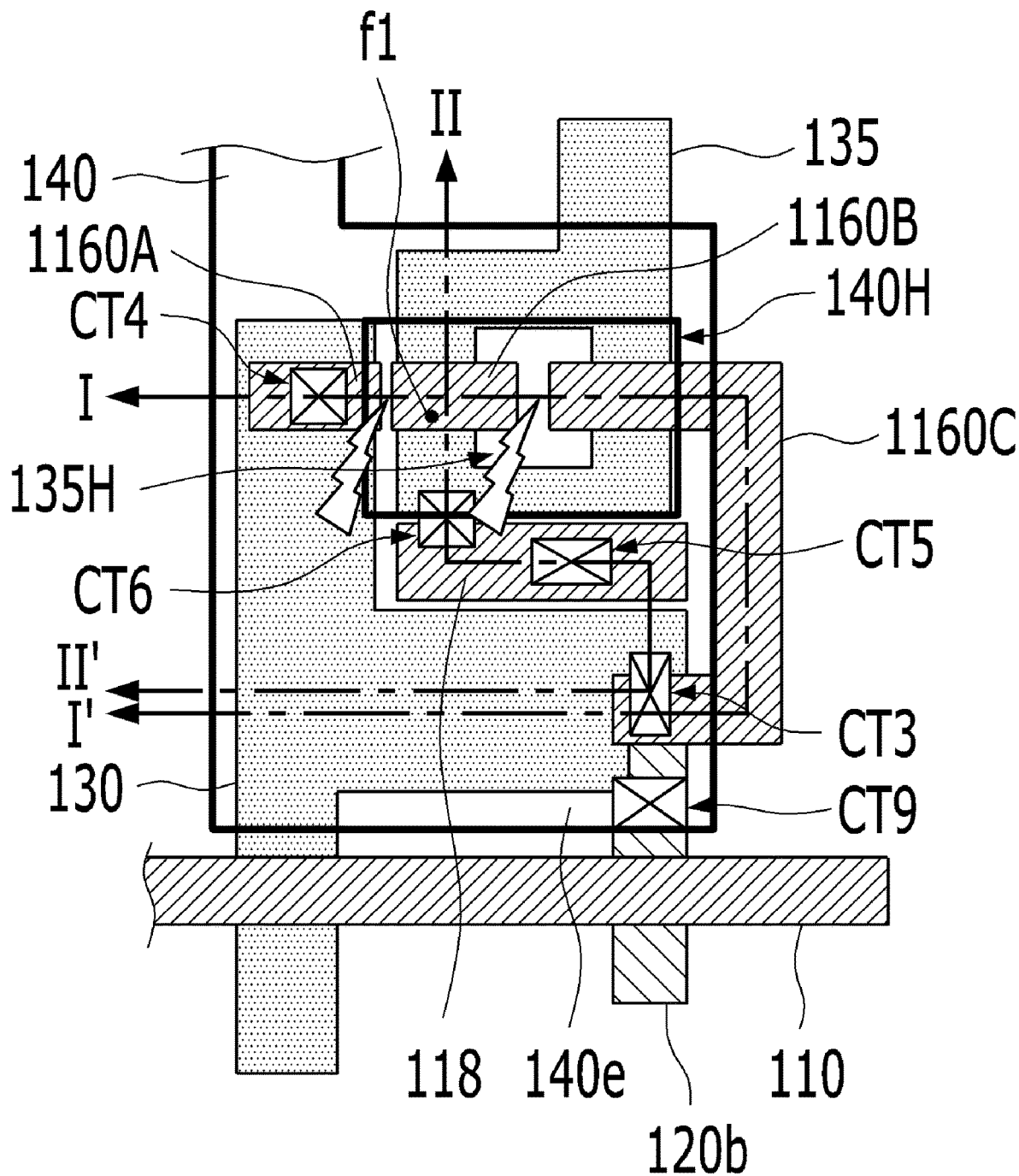
FIG. 7 is a plan view showing a method of repairing a light emitting display device according to a first embodiment of the present disclosure.
Figure 8A:
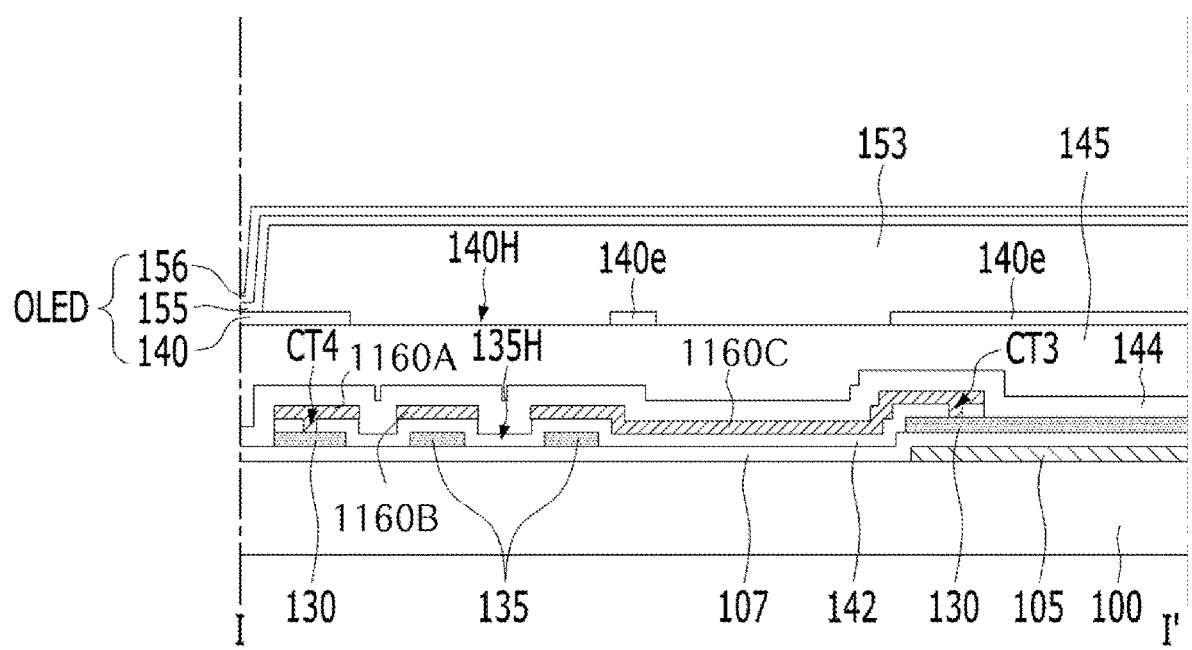
FIGS. 8A and 8B are sectional views taken along lines I-I' and II-II' of FIG. 7, respectively.
Figure 8B:
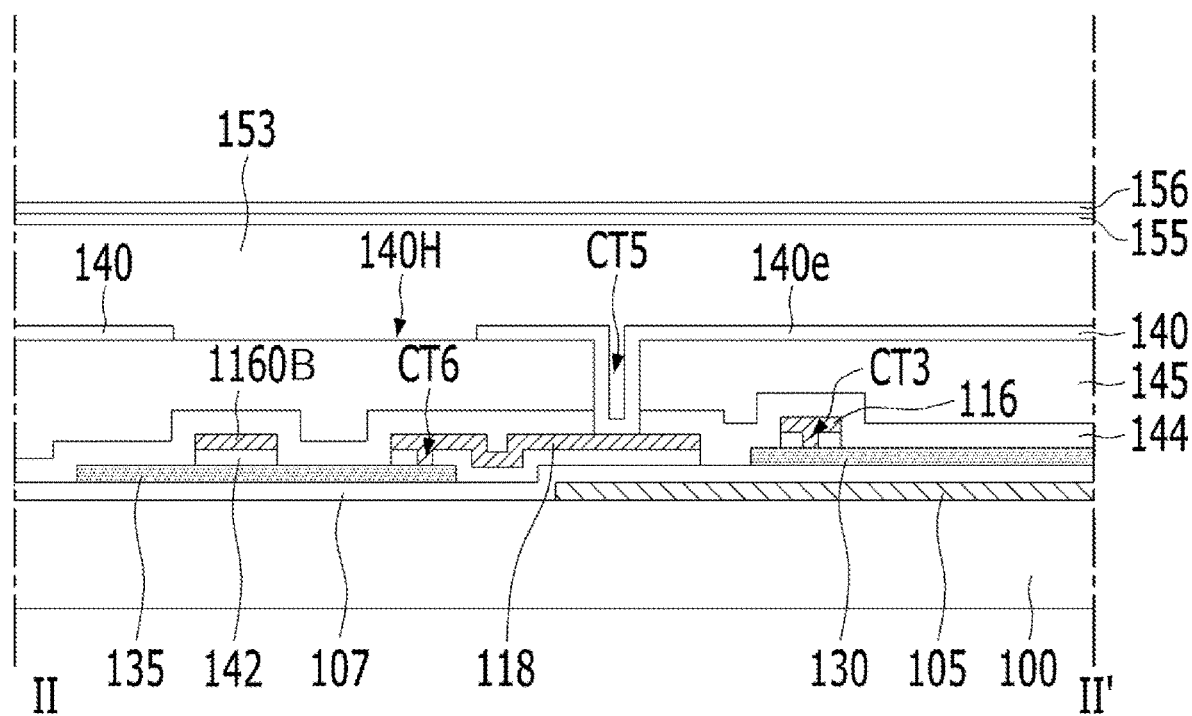
Figure 9:
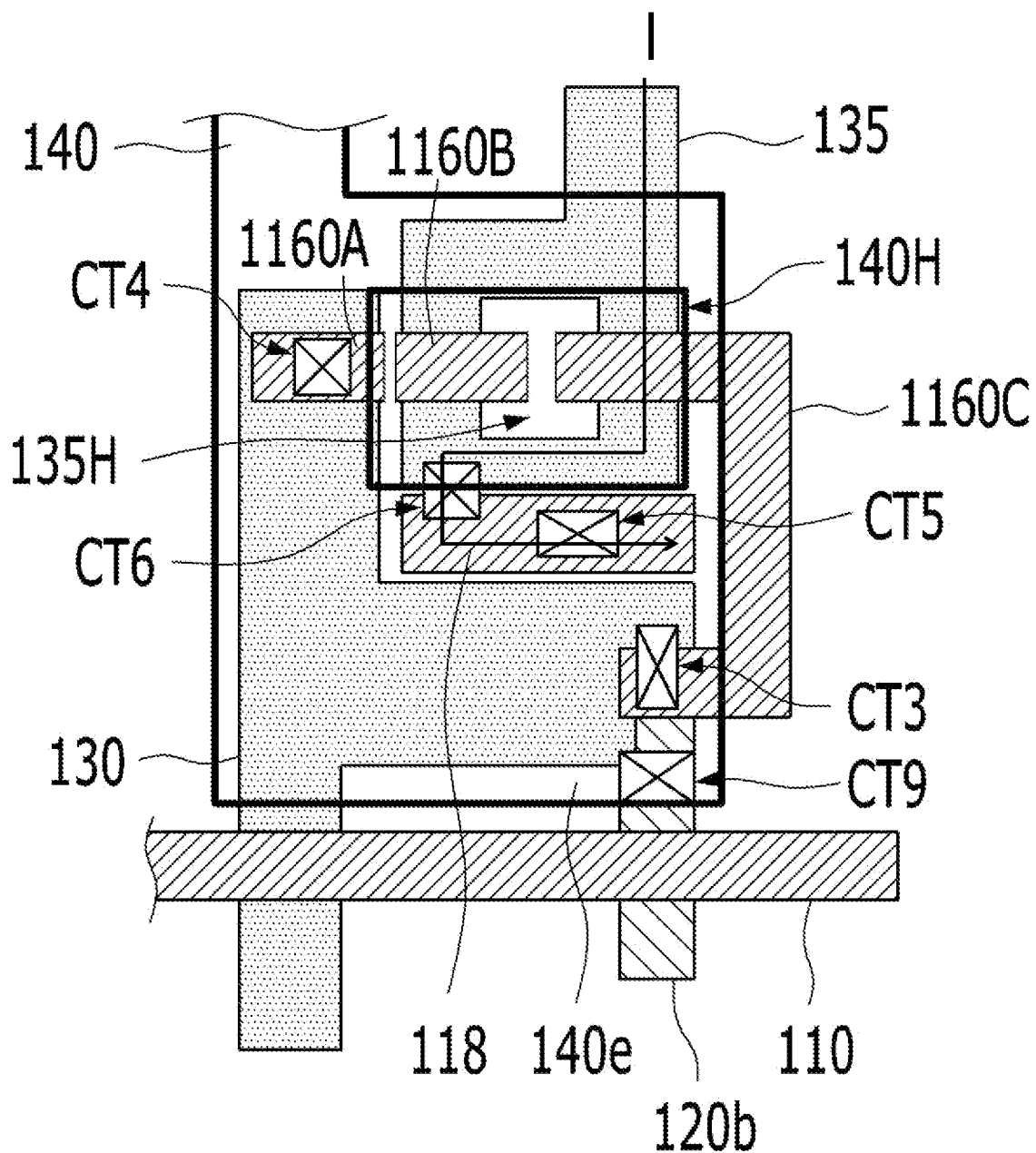
FIG. 9 is a view showing a current path in a driving transistor after repair of FIG. 7.

In particular, FIG. 7 is a plan view showing a method of repairing a light emitting display device according to a first embodiment of the present disclosure, FIGS. 8A and 8B are sectional views taken along lines I-I' and II-II' of FIG. 7, respectively, and FIG. 9 is a view showing a current path in a driving transistor after repair of FIG. 7.

When a short circuit occurs in the area of the metal pattern overlapping the active layer pattern due to a foreign matter in a foreign matter inspection step, the area can be designated as an abnormal area. As shown in FIG. 7, the method of repairing the light emitting display device according to the first embodiment of the present disclosure is performed to normalize the portion at which short circuit occurs between the driving gate electrode 116 and the first active layer pattern 135 at the portion at which foreign matter f1 is located (i.e., at the portion of the first active layer pattern 135 located at the left side of the first hole 135H in FIG. 7).

As shown in FIGS. 7 to 8B, a laser is applied to the driving gate electrode 116 disposed at opposite sides of the foreign matter f1 in a non-overlapping state from under the substrate 100 to separate the driving gate electrode 116 from the surroundings thereof. After laser application, the portion 1160B of the driving gate electrode 116 is divided or separated from the driving gate electrode patterns 1160A and 1160C connected to opposite sides of the second active layer pattern 130 in a floating state.

Consequently, the floating driving gate electrode pattern 1160B remains at the portion at which the foreign matter f1 is located, whereby no electrical signal is applied. Instead, in the driving transistor DR, as shown in FIGS. 3 and 9, when current flows from the driving drain electrode 115a protruding from the driving source voltage line 115 to the first active layer pattern 135 via the seventh contact hole CT7, the current flows to the first active layer pattern 135 at the right side of the first hole 135H, which is the side opposite the foreign matter f1. The current is also applied to the first electrode 140 through the first electrode extension portion 140e via the sixth contact hole CT6 and the fifth contact hole CT5. In this instance, the portion of the first active layer pattern 135 overlapping the driving gate electrode 116 located at the right side of the first hole 135H functions as a channel, and therefore the driving gate electrode 116 of the driving transistor DR can be normally operated after laser application.

Figure 10:
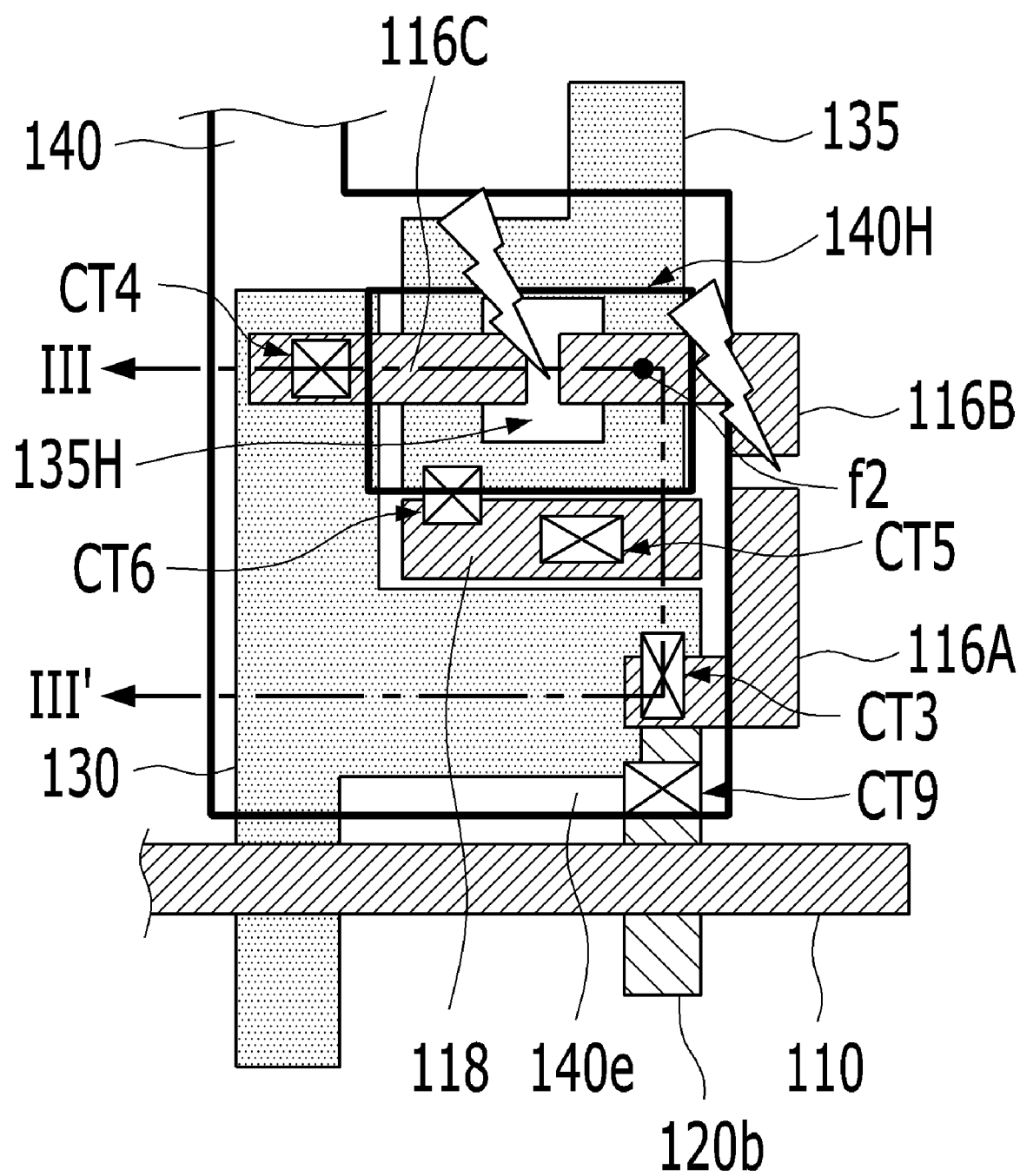
FIG. 10 is a plan view showing a method of repairing a light emitting display device according to a second embodiment of the present disclosure.
Figure 11:
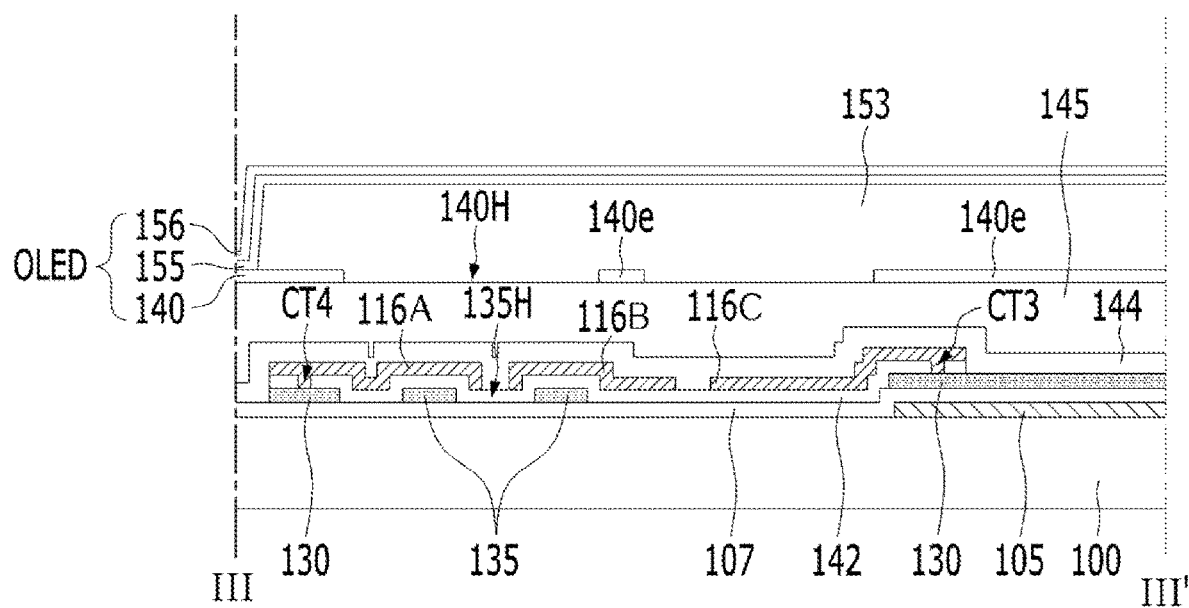
FIG. 11 is a sectional view taken along line of FIG. 10.

Next, FIG. 10 is a plan view showing a method of repairing a light emitting display device according to a second embodiment of the present disclosure, and FIG. 11 is a sectional view taken along line III-III' of FIG. 10. In particular, FIGS. 10 and 11 show the method of repairing the light emitting display device when foreign matter f2 is generated at the portion of the first active layer pattern 135 located at the right side of the first hole 135H, the driving transistor DR is normalized as the result of short circuit occurring between the driving gate electrode 116 and the first active layer pattern 135 at the portion at which the foreign matter f2 is located.

As shown in FIGS. 10 and 11, a laser is applied to the driving gate electrode 116 disposed at opposite sides of the foreign matter f2 in a non-overlapping state from under the substrate 100 to separate the driving gate electrode from the surroundings thereof. In this instance, the portion to which the laser is applied includes the area where the driving gate electrode 116 does not overlap the other metal and the active layer pattern. That is, the lasered portions include the areas of the driving gate electrode 116 in the first hole 135H and outside the first electrode extension portion 140e, as shown in FIG. 10.

After the laser application, the portion 116B of the driving gate electrode 116 including the foreign matter f2 is divided or separated from the driving gate electrode patterns 116A and 116C connected to opposite sides of the second active layer pattern 130 in a floating state. Consequently, the floating driving gate electrode pattern 116B remains at the portion at which the foreign matter f2 is located, whereby no electrical signal is applied.

Instead, in the driving transistor DR, as shown in FIGS. 3, 10, and 11, when current flows from the driving drain electrode 115a protruding from the driving source voltage line 115 to the first active layer pattern 135 via the seventh contact hole CT7, the current flows to the first active layer pattern 135 at the left side of the first hole 135H, which is the side opposite the foreign matter f2, and is applied to the first electrode 140 through the first electrode extension portion 140e via the sixth contact hole CT6 and the fifth contact hole CT5. In this instance, the portion of the first active layer pattern 135 overlapping the driving gate electrode 116 located at the left side of the first hole 135H functions as a channel, and therefore the driving gate electrode 116 of the driving transistor DR can be normally operated after repair by laser application.

As is apparent from the above description, a light emitting display device according to embodiments of the present disclosure and a method of repairing the same have the following advantages. First, a hole is provided in an active layer, a gate metal is provided so as not to overlap another metal at the portion at which the hole is located, the gate metal is floated through the hole, and a transistor is detoured to the floated gate metal, whereby normalization is achieved. Even when foreign matter is generated at a subpixel, normalization is achieved through a repair of the subpixel, whereby the subpixel is operated as an effective subpixel.

Second, a hole is also provided at a first electrode or a first electrode extension portion to overlap the hole of the active layer, whereby only the metal is affected, but the operation of the first electrode is not affected, at the time of laser application, and therefore it is possible to stabilize the operation of an emission portion of the subpixel.

Third, when a hole for repair is provided in a first active layer included in a driving transistor configured to supply driving current to a light emitting diode, one side and the other side of the driving gate electrode are connected to a second active layer or a third active layer spaced apart from the first active layer, whereby a detour operation is possible even when a part of the interior of the driving gate electrode floats.

While the embodiments of the present disclosure have been described with reference to the accompanying drawings, the present disclosure is not limited to the embodiments and may be embodied in various different forms, and those skilled in the art will appreciate that the present disclosure may be embodied in specific forms other than those set forth herein without departing from the technical idea and essential characteristics of the present disclosure. The disclosed embodiments are therefore to be construed in all aspects as illustrative and not restrictive.

What is claimed is:

1. A light emitting display device comprising:
a substrate;
a plurality of subpixels on the substrate, each subpixel including a driving transistor and a light emitting diode connected to the driving transistor; and
a plurality of scan and data lines electrically connected with the plurality of subpixels,
wherein the driving transistor comprises:
a driving gate electrode;
a first active layer pattern including a first area not overlapping the driving gate electrode and a second area overlapping the driving gate electrode, wherein the second area includes a first hole overlapping with the driving gate electrode;
a driving drain electrode connected to a first portion of the first area; and
a driving source electrode connected to a second portion of the first area spaced apart from the first portion of the first area,
wherein the light emitting diode comprises a first electrode, an organic emission layer on the first electrode and a second electrode on the organic emission layer, and
wherein a first electrode extension portion extending from the first electrode to the driving transistor has a second hole larger than the first hole.

2. The light emitting display device according to claim 1, wherein each subpixel is divided into an emission portion and a driving circuit, and
wherein the first electrode is provided at the emission portion and the first electrode extension portion is provided at the driving circuit and the second hole overlaps an entirety of the first hole.

3. The light emitting display device according to claim 1, wherein the driving gate electrode comprises:
a first non-overlapping portion not overlapping the first active layer pattern and the first electrode extension portion in the first hole; and
a second non-overlapping portion spaced apart from the first non-overlapping portion and that does not overlap the first active layer pattern and the first electrode extension portion between one side and the other side of the driving gate electrode.

4. The light emitting display device according to claim 3, wherein, in at least one of the subpixels, the first non-overlapping portion and the second non-overlapping portion are electrically separated from each other at the driving gate electrode.

5. The light emitting display device according to claim 3, wherein the second non-overlapping portion of the driving gate electrode is located outside the first active layer pattern around the first hole in the second hole or is provided outside the first electrode extension portion.

6. The light emitting display device according to claim 1, wherein the driving drain electrode includes a first connection at a portion overlapping the first electrode extension portion, and a second connection with the first active layer pattern at one side thereof, and
wherein the driving drain electrode is on a same layer as the driving gate electrode.

7. The light emitting display device according to claim 2, further comprising:
a scan line and a data line among the plurality of scan and data lines intersecting each other at the driving circuit of the substrate to divide the subpixels from each other;
a switching transistor at a portion overlapping the scan line;
a sensing line parallel to the scan line; and
a sensing transistor at a portion that overlaps the sensing line.

8. The light emitting display device according to claim 7, wherein the switching transistor comprises:
a second active layer pattern on a same layer as the first active layer pattern and spaced apart from the first active layer pattern; and
a switching source electrode protruding from the data line, and extending and connecting to one side of the second active layer pattern, and
wherein the driving gate electrode is connected to the other side of the second active layer pattern.

9. The light emitting display device according to claim 8, wherein at least one side of the driving gate electrode is connected to the second active layer pattern.

10. The light emitting display device according to claim 1, wherein the first portion of the first area of the first active layer pattern is at an opposite side of the first hole than the second portion of the first area of the first active layer pattern.

11. The light emitting display device according to claim 1, wherein the first hole has a square shape.

12. The light emitting display device according to claim 1, wherein the driving drain electrode is connected to the first active layer pattern via a first contact hole at the first portion of the first area.

13. The light emitting display device according to claim 12, wherein the driving source electrode is connected to the first active layer pattern via a second contact hole at the second portion of the first area.

14. The light emitting display device according to claim 13, wherein the driving gate electrode includes an extension portion extending across the first hole and portions of the first active layer pattern outside of the first hole, and
wherein the extension portion of the driving gate electrode is connected to a second active layer pattern via a third contact hole.

15. The light emitting display device according to claim 14, wherein a spacing exists between the first and second active layer patterns such that the extension portion extends across both the first hole and the spacing between the first and second active layer patterns.

16. The light emitting display device according to claim 14, wherein the extension portion of the driving gate electrode includes first, second and third portions separated from each other,
   wherein the first portion is separated from the second portion at the spacing between the first and second active layers, and
   wherein the second portion is separate from the third portion at the first hole.

17. The light emitting display device according to claim 1, wherein the driving gate electrode includes an extension portion extending across the first hole and portions of the first active layer pattern outside of the first hole,
   wherein the driving gate electrode further includes another portion not overlapping the first active layer pattern and integrally formed with the extension portion,
   wherein the extension portion of the driving gate electrode is connected to a second active layer pattern via a third contact hole,
   wherein a spacing exists between the first and second active layer patterns such that the extension portion extends across both the first hole and the spacing between the first and second active layer patterns,
   wherein the driving gate electrode includes first, second and third portions separated from each other,
   wherein the first portion is separated from the second portion at the first hole,
   wherein the second portion is separated from the third portion at the-spacing between the first and second active layer patterns, and
   wherein the second portion is separate from the third portion at the other portion not overlapping the first active layer pattern.

* * * * *